(12) United States Patent
Scott et al.

(10) Patent No.: US 12,489,408 B2
(45) Date of Patent: Dec. 2, 2025

(54) POWER AMPLIFIER SYSTEM

(71) Applicant: Qorvo US, Inc., Greensboro, NC (US)

(72) Inventors: Baker Scott, San Jose, CA (US);
George Maxim, Saratoga, CA (US);
Chong Woo, Fremont, CA (US)

(73) Assignee: Qorvo US, Inc., Greensboro, NC (US)

( * ) Notice: Subject to any disclaimer, the term of this patent is extended or adjusted under 35 U.S.C. 154(b) by 485 days.

(21) Appl. No.: 17/972,795

(22) Filed: Oct. 25, 2022

(65) Prior Publication Data
US 2023/0163734 A1 May 25, 2023

Related U.S. Application Data

(60) Provisional application No. 63/281,366, filed on Nov. 19, 2021.

(51) Int. Cl.
*H03F 1/22* (2006.01)
*H03F 3/195* (2006.01)
*H03F 3/24* (2006.01)

(52) U.S. Cl.
CPC ............. *H03F 3/195* (2013.01); *H03F 3/245* (2013.01); *H03F 2200/451* (2013.01)

(58) Field of Classification Search
CPC .................................. H03F 1/22; H03F 1/02
USPC ...................................... 330/311, 124 R, 295
See application file for complete search history.

(56) References Cited

U.S. PATENT DOCUMENTS

| 5,045,804 | A | * | 9/1991 | Sugawara | ............... | H03G 3/348 |
| | | | | | | 327/411 |
| 7,486,136 | B2 | * | 2/2009 | Bakalski | ............... | H03F 1/0288 |
| | | | | | | 330/51 |
| 8,306,494 | B2 | | 11/2012 | Ojo | | |
| 10,938,349 | B1 | * | 3/2021 | Ayranci | ................... | H03F 3/193 |
| 11,757,412 | B2 | * | 9/2023 | Sutskover | ............... | H03F 3/195 |
| | | | | | | 330/294 |
| 2014/0167841 | A1 | * | 6/2014 | Henshaw | .............. | H03F 1/0277 |
| | | | | | | 330/127 |
| 2021/0126587 | A1 | | 4/2021 | Panseri et al. | | |

OTHER PUBLICATIONS

International Search Report and Written Opinion for International Patent Application No. PCT/US2022/080177, mailed Apr. 3, 2023, 13 pages.

* cited by examiner

*Primary Examiner* — Henry Choe
(74) *Attorney, Agent, or Firm* — Withrow & Terranova, P.L.L.C.

(57) ABSTRACT

A power amplifier system is disclosed having an N number of transistors coupled together drain-to-source between a supply node and a fixed voltage node, wherein a first one of the N number of transistors coupled nearest to the fixed voltage node is configured to operate as an amplifying device in an ON-mode, and remaining ones of the N number of transistors are configured to operate as cascode devices in the ON-mode and to operate as turned-off switches in an OFF-mode. A controller is configured to place the N number of transistors in the first mode when a radio frequency (RF) signal is to be amplified by the first one of the N number of transistors and to place the N number of transistors in the second mode when the RF signal is not to be amplified by the first one of the N number of transistors.

27 Claims, 7 Drawing Sheets

POWER AMPLIFIER SYSTEM

RELATED APPLICATIONS

This application claims the benefit of provisional patent application Ser. No. 63/281,366, filed Nov. 19, 2021, the disclosure of which is hereby incorporated herein by reference in its entirety.

FIELD OF THE DISCLOSURE

The present disclosure relates to a power amplifier system in a front-end transmit architecture that eliminates a typically used series switch from the output signal path.

BACKGROUND

Traditional front-end modules use a physical switch component in the transmit path from the power amplifier to the antenna. Such component disconnects the power amplifier when not in transmit mode. During the transmit mode the switch is in series with the power amplifier output, resulting in an unwanted insertion loss and thus a loss in efficiency for the module. In most cases the power amplifier and the switch are implemented with different technologies, often on different integrated circuits, for example, a gallium arsenide (GaAs) power amplifier and silicon-on-insulator complementary metal oxide semiconductor (SOI-CMOS) switch.

SUMMARY

A power amplifier system is disclosed having an N number of transistors coupled together drain-to-source between a supply node and a fixed voltage node, wherein a first one of the N number of transistors coupled nearest to the fixed voltage node is configured to operate as an amplifying device in an ON-mode, and remaining ones of the N number of transistors are configured to operate as cascode devices in the ON-mode and to operate as turned-off switches in an OFF-mode. A controller is configured to place the N number of transistors in the ON-mode when a radio frequency (RF) signal is to be amplified by the first one of the N number of transistors and to place the N number of transistors in the OFF-mode when the RF signal is not to be amplified by the first one of the N number of transistors.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures.

It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 1:
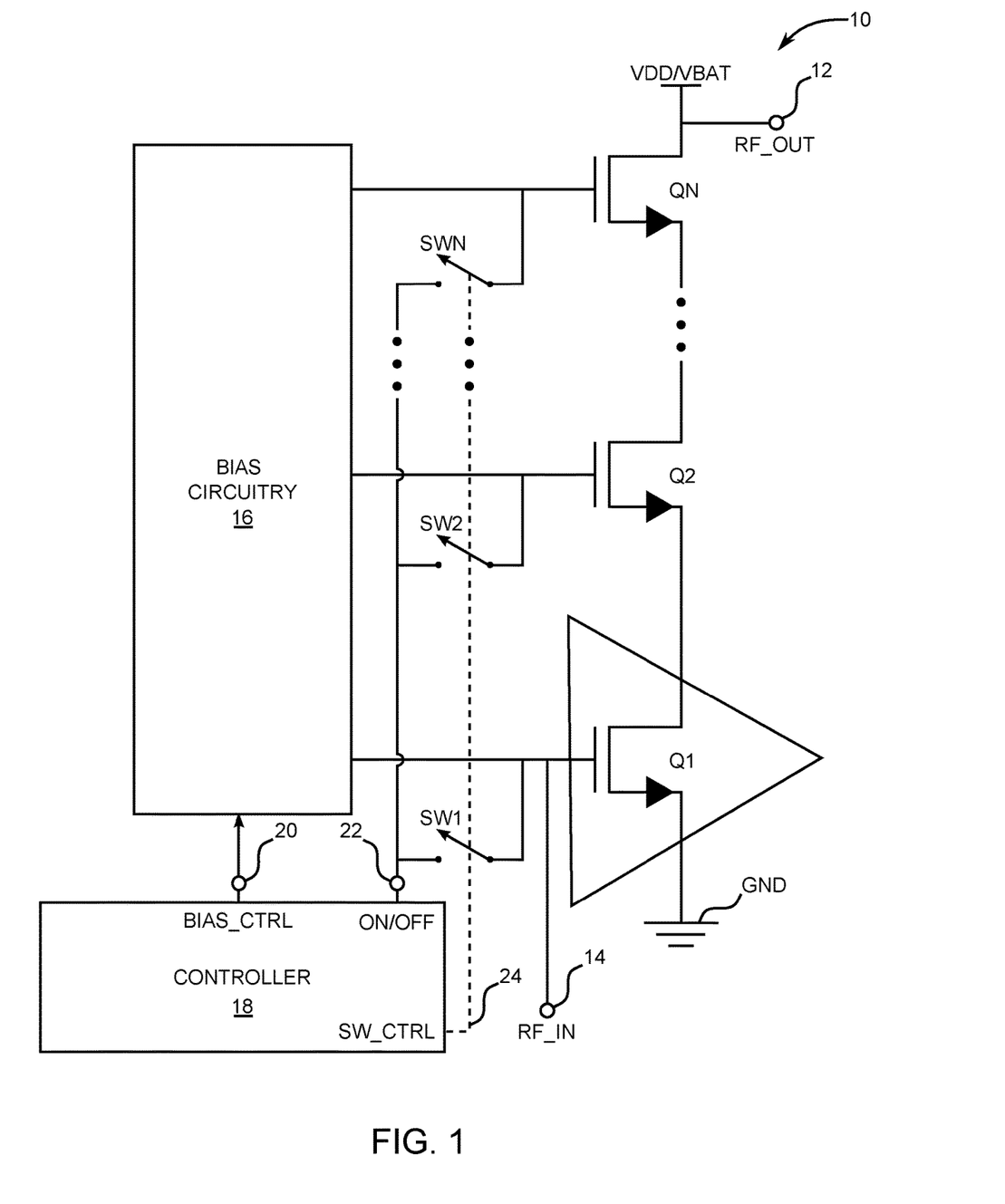
FIG. 1 is a general diagram of a power amplifier system having transconductance and cascode devices that are configured to selectively operate as an amplifier in an ON-mode or as switch in an OFF-mode.

FIG. 1 is a general diagram of a power amplifier system 10. A transmit path is turned off when not transmitting a radio frequency signal to avoid unwanted leakages into a load such as an antenna. A series switch or a combination of series and parallel switches are used for this action.

In this regard, the power amplifier system 10 has an N number of transistors Q1 and Q2 through QN that are configured to selectively operate as an amplifier in an ON-mode or as a switch in an OFF-mode. In the ON-mode, a substantial current is allowed to flow through the transistors Q2 through QN. In the OFF-mode, practically no current flows through the transistors Q2 through QN.

The amplifier system 10, which is typically integrated within a front-end module's (FEM) transmit architecture, eliminates a traditional series switch from an output signal path and thus results in lower insertion loss and thus better efficiency. A radio frequency (RF) output terminal 12 that is labeled RF_OUT is included in the output signal path. In the exemplary embodiment depicted in FIG. 1, the RF output terminal 12 is coupled to a drain of the transistor QN. An RF input terminal 14 labeled RF_IN is coupled to a gate of the transistor Q1. In the ON-mode, an RF signal received at the RF input terminal 14 is amplified by the transistor Q1 and is output at the RF output terminal 12. In this case, in the ON-mode the transistor Q1 functions as a transconductance device.

The power amplifier system 10 also includes bias circuitry 16 and a controller 18. The bias circuitry 16 is configured to generate selectable bias levels for the N number of transistors Q1 and Q2 through QN under control of the controller 18 by way of a bias control terminal 20, which is labeled BIAS_CTRL in FIG. 1.

In the exemplary embodiment depicted in FIG. 1, the power amplifier system 10 also includes an N number of gate switches SW1 and SW2 through SWN, one of each being coupled between a respective gate of the transistors Q1 and Q2 through QN and an ON/OFF voltage output terminal 22, which is labeled ON/OFF in FIG. 1. The controller 18 further includes a switch control bus 24, labeled CTRL and depicted in dashed line. The switch control bus 24 may be used to control the opening and closing of each of the switches SW1 through SWN individually or simultaneously in various embodiments. The controller 18 is also configured to generate a voltage signal at the ON/OFF output terminal that is applied to the gates of the switches SW1 through SWN when the switches SW1 through SWN are closed to place the transistors Q2 through QN in the OFF-mode. Transistors Q2 through QN are configured to function as cascode devices and voltage protection devices in the ON-mode or as a series switch in the OFF-mode.

The amplifier system 10 may be realized with complementary metal oxide semiconductor (CMOS) power amplifiers but may also be realized in other configurations, such as junction field-effect transistors, pseudomorphic high electron mobility transistors (pHEMTs), and other types of amplifiers in which several transistors are cascaded to sustain the large output voltage swing. The amplifier system 10 according to the present disclosure may be fabricated using bulk and silicon-on-insulator (SOI)/silicon-on-sapphire fabrication processes. In the case of a SOI, a more even distribution of the radio frequency (RF) voltage over the cascoded transistors Q2 through QN operated as switches can be achieved, resulting usually in a higher maximum operating power. In at least some embodiments, the N number of transistors are of the partially depleted SOI complementary metal oxide semiconductor (CMOS) type. In other embodiments, the N number of transistors are of the fully depleted SOI CMOS type.

Each of the transistors Q1 through QN needs to handle properly the RF signal when operating as an amplifier. The transconductance device that is transistor Q1 needs minimum series resistance in the gate. For this reason, in some embodiments, a series switch in the gate of the transconductance device may be omitted as depicted in FIG. 1.

Figure 2:
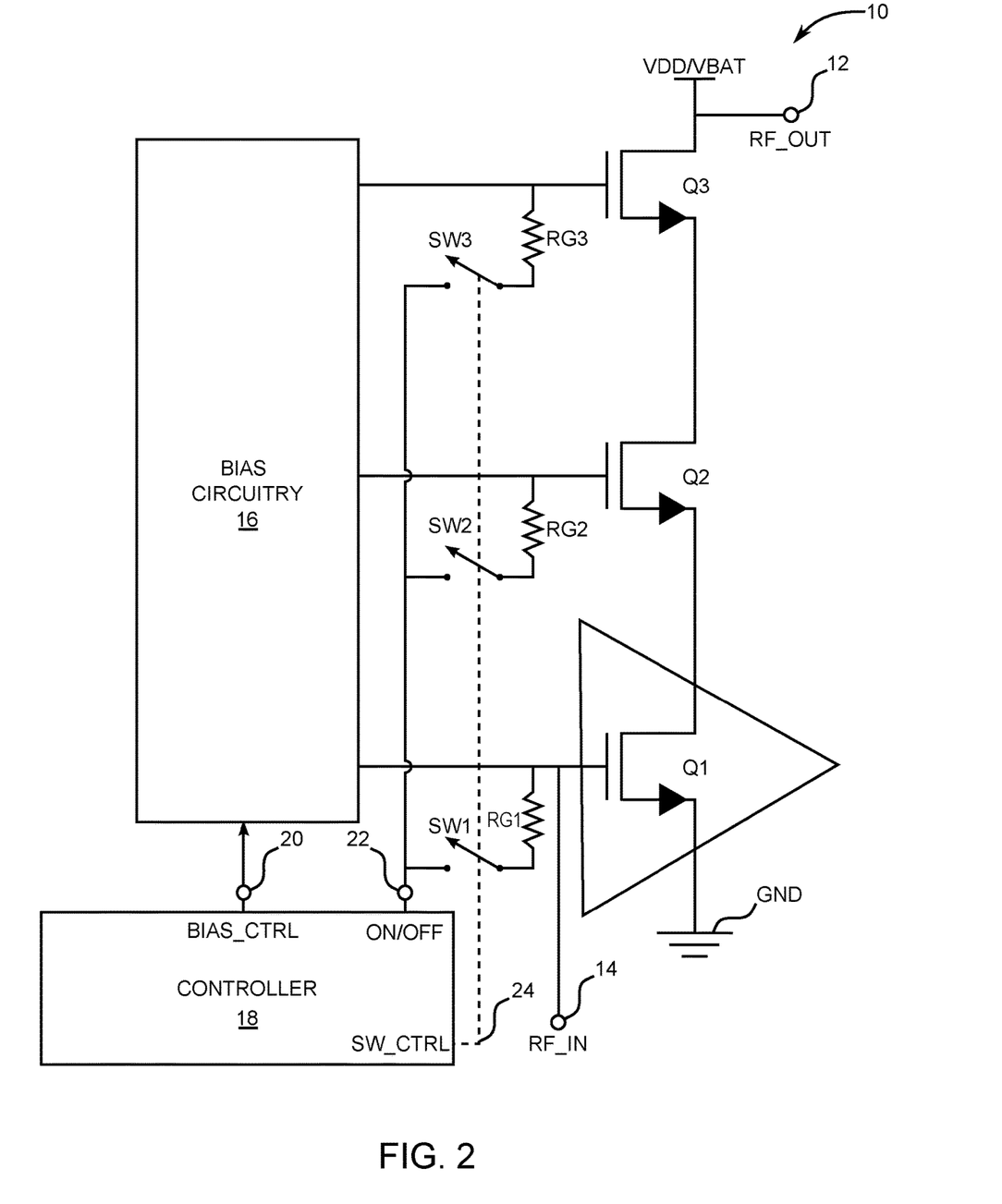
FIG. 2 is a diagram showing an embodiment of the power amplifier system that includes selectable gate resistors.

There are many ways in which the switches may be configured. In FIG. 2, the Nth transistor is Q3 and the Nth switch is SW3. The exemplary embodiment of FIG. 2 includes gate resistors RG1, RG2, and RG3 coupled between the gates of transistors Q1, Q2, and Q3 and the switches SW1, SW2, and SW3, respectively. Note that FIG. 2 depicts a double-pole single-throw reconfigurable switch configuration. Other connections are also possible. For example, the transconductance device may be re-routed as a series device from the signal path perspective.

Figure 3:
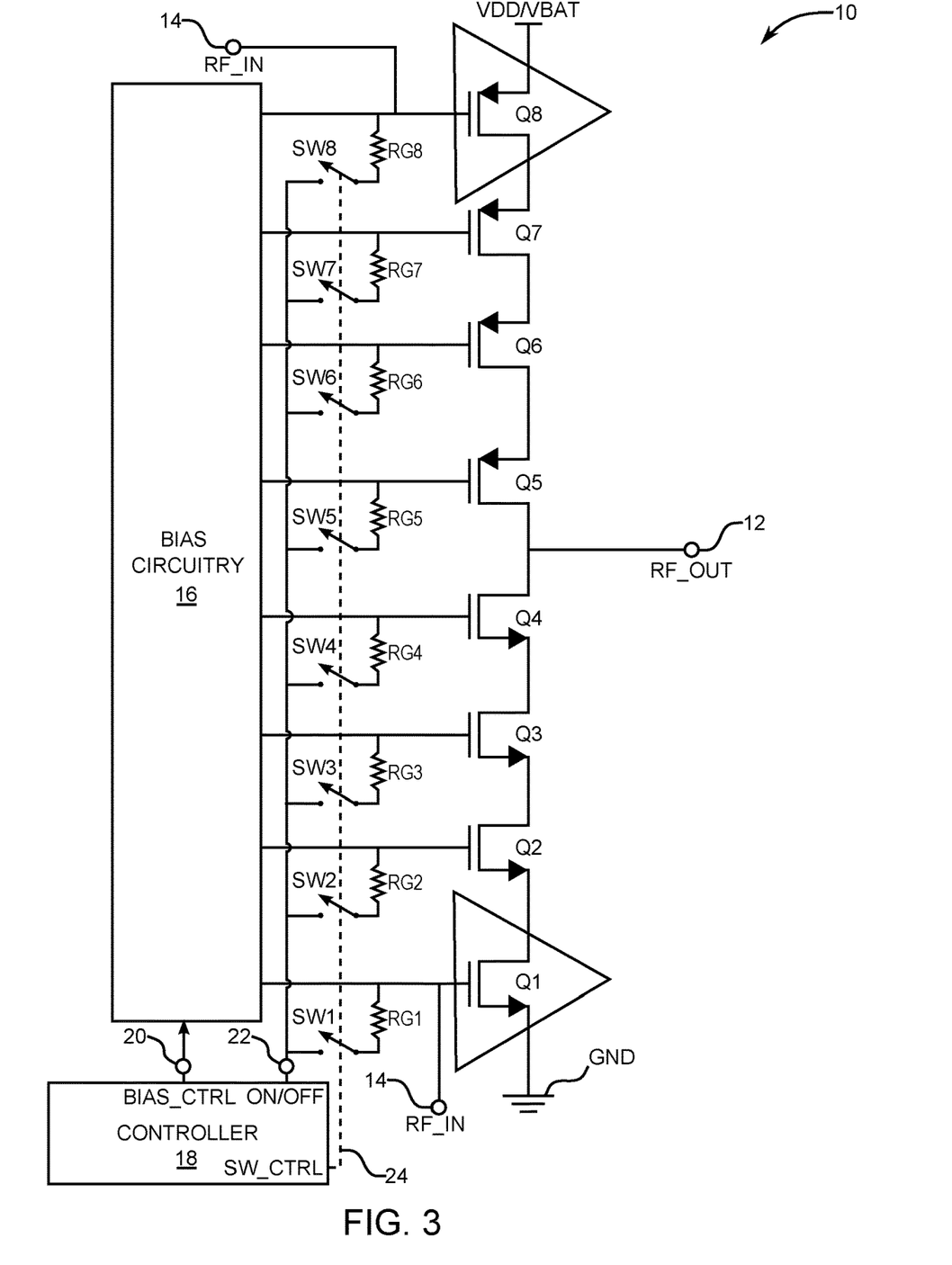
FIG. 3 is a diagram showing an embodiment the power amplifier system in a reconfigurable complementary amplifier configuration.

This and other reconfigurable switch configurations are realizable for both N-type cascaded amplifiers and P-type cascaded amplifiers. Furthermore, the reconfigurable switch configuration can be generalized for the complementary N-type and P-type amplifiers as shown in FIG. 3. In this case there are two sets of cascode transistors in which Q2, Q3, and Q4 are N-type devices and transistors Q5, Q6, and Q7 are P-type devices. In this exemplary embodiment, there are two transconductance devices, which are the transistor Q1 and a transistor Q8. The transistor Q1 is an N-type device and the transistor Q8 is a P-type device. Also, in this exemplary embodiment, the controller 18 is further configured to reconfigure all of the transistors Q1 through Q8 as switches in the OFF mode, or only a subset of the transistors Q1 through Q8 may be reconfigured to operate as switches. Gate resistors RG4, RG5, RG6, RG7, and RG8 are coupled between the gates of the transistors Q4, Q5, Q6, Q7, and Q8 and switches SW5, SW6, SW7, and SW8, respectively.

A reason for the disclosed reconfigurable switch configurations is to have protection in both ON-mode and the OFF-mode. One advantage is that the same ones of the transistors Q1 through Q8 may be used to provide protection in both the ON-mode and the OFF-mode. Another advantage is that the power amplifier system 10 reuses the same ones of the transistors Q1 through Q8 to implement both an amplifier function in the ON-mode and a switch function in the OFF-mode and thus takes significantly less footprint for the amplifier system 10, which results in a smaller and lower cost solution.

Furthermore, in most cases the amplifier and the switch components are realized with different processes and often are integrated in different integrated circuits. The power amplifier can often be a bipolar or heterojunction bipolar transistor (HBT) process—silicon germanium (SiGe), gallium arsenide (GaAs), indium phosphide (InP), and gallium nitride (GaN), for example—while the switch is done in SOI-CMOS. The main drawback of this configuration is the extra insertion loss brought by the physical dedicated series switch.

In many FEMs, the power amplifier is built with high-voltage devices—HBT, pHEMT, and laterally diffused metal oxide semiconductor (LD-MOS), for example—that can handle the entire large output signal swing in a single device.

For the switch, the MOS processes have much lower breakdown voltage and require a number of MOS—field-effect transistors (FETs) to be stacked in order to handle the maximum signal level. The insertion loss of the switch is further increased if a higher linearity is needed (larger number of stacked devices) or multiple branches are switched together.

In the case of CMOS power amplifiers, the output stage needs to be cascaded anyway since the breakdown voltage of each individual MOSFET is much lower than the maximum signal that is handled. This is true for both bulk and SOI CMOS implementations.

Figure 4:
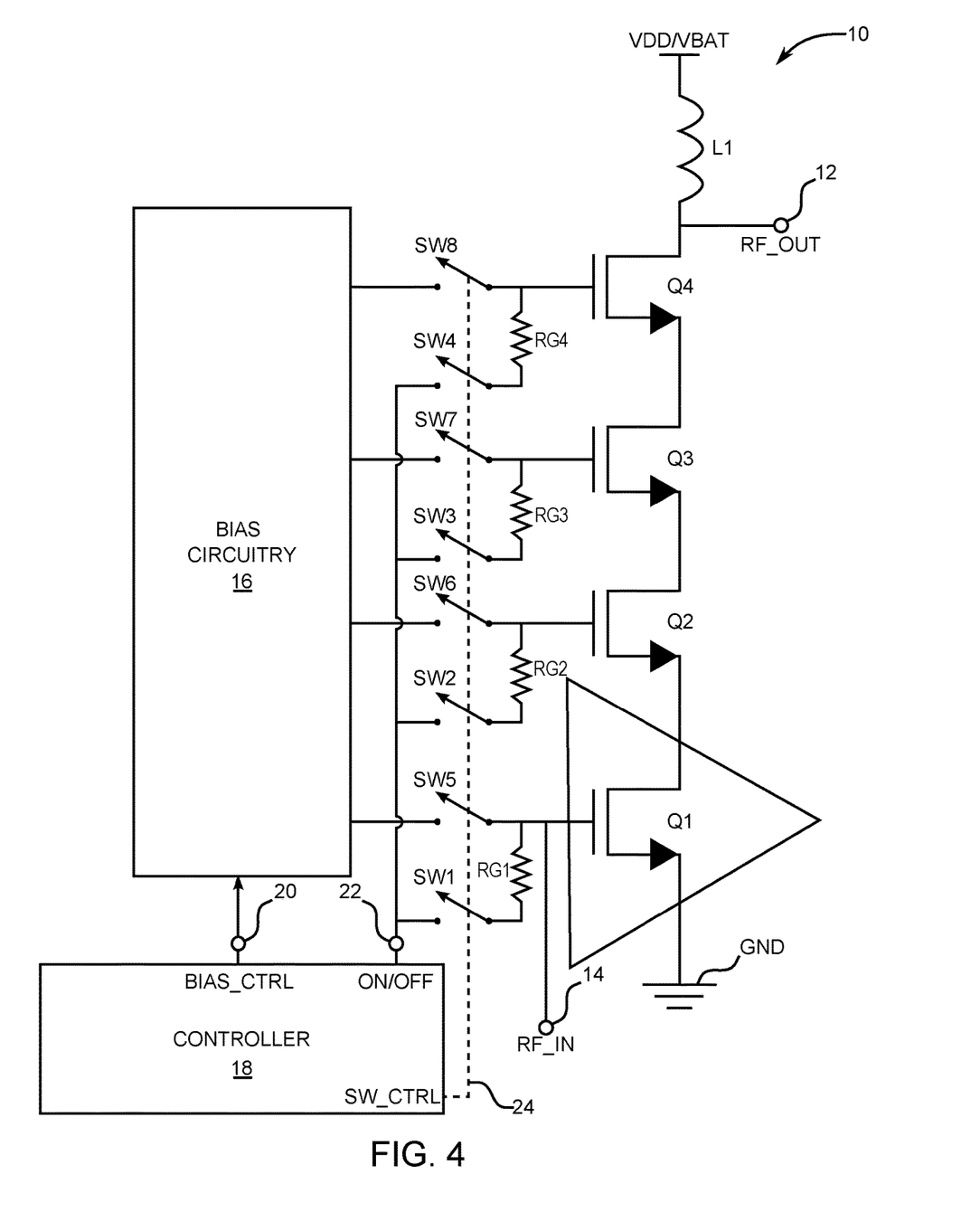
FIG. 4 is a diagram showing an embodiment of the power amplifier system further including selectable bias switches.

FIG. 4 is a schematic depicting an embodiment in which additional switches SW5, SW6, SW7, and SW8 are coupled between the respective gates of the transistors Q1, Q2, Q3, and Q4 and the bias circuitry 16. The controller 18 is further configured to selectively couple the gates of the transistors Q1, Q2, Q3, and Q4 to the bias circuitry 16 in the ON-mode and to selectively decouple the gates of the transistors Q1, Q2, Q3, and Q4 from the bias circuitry 16 in the OFF-mode. At least one advantage of this exemplary embodiment is increased isolation of the amplifier system 10 from other portions of an FEM (not shown). The supply voltage VDD/VBAT is isolated from RF signals by way of an inductor L1 coupled between the supply voltage VDD/VBAT and the RF output 12.

Figure 5:
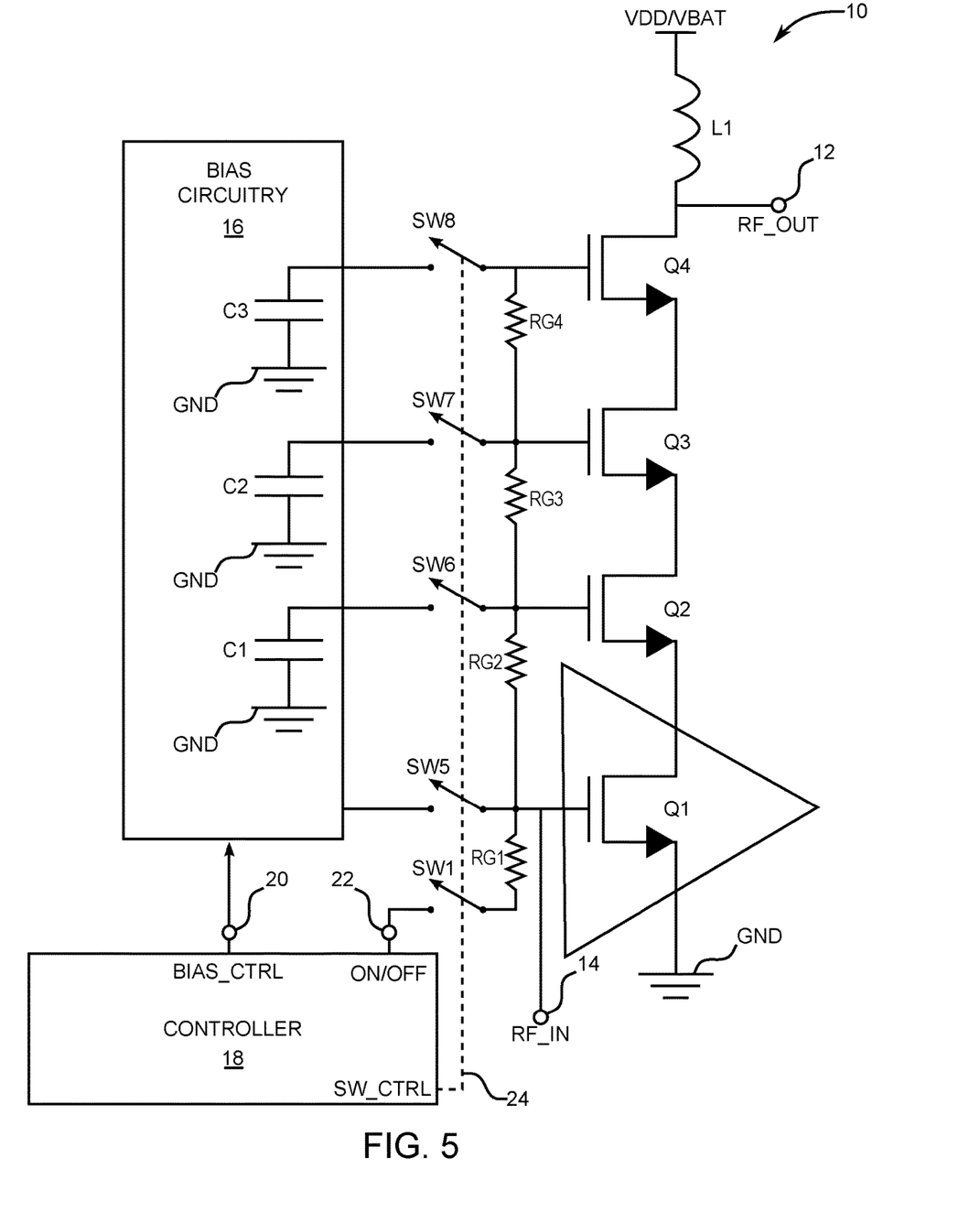
FIG. 5 is a diagram showing an embodiment of the power amplifier system having bypass capacitors selectably coupled to gates of the cascode devices.

As depicted in FIG. 5 the cascode devices that are transistors Q2, Q3, and Q4 need bypass capacitances when the power amplifier system 10 is operated in the ON-mode. Moreover, the transistors Q2, Q3, and Q4 need to have large series resistors RG1, RG2, RG3, and RG4 in the OFF-mode to ensure an even distribution of the large RF signal on the transistors Q1, Q2, Q3, and Q4 that are stacked FETs in this and other embodiments. A first bypass capacitor C1 is coupled between the fixed voltage node GND and the switch SW6. The controller 18 is configured to selectively couple the first bypass capacitor C1 to the gate of the transistor Q2 when the power amplifier system 10 is in the ON-mode amplifying signals that arrive at the RF input 14. A second bypass capacitor C2 is coupled between the fixed voltage node GND and the switch SW7. The controller 18 is also configured to selectively couple the second bypass capacitor C2 to the gate of the transistor Q3 when the power amplifier system 10 is in the ON-mode. A third bypass capacitor C3 is coupled between the fixed voltage node GND and the switch SW8. The controller 18 is further configured to selectively couple the third bypass capacitor C3 to the gate of the transistor Q4 when the power amplifier system 10 is in the ON-mode.

Figure 6:
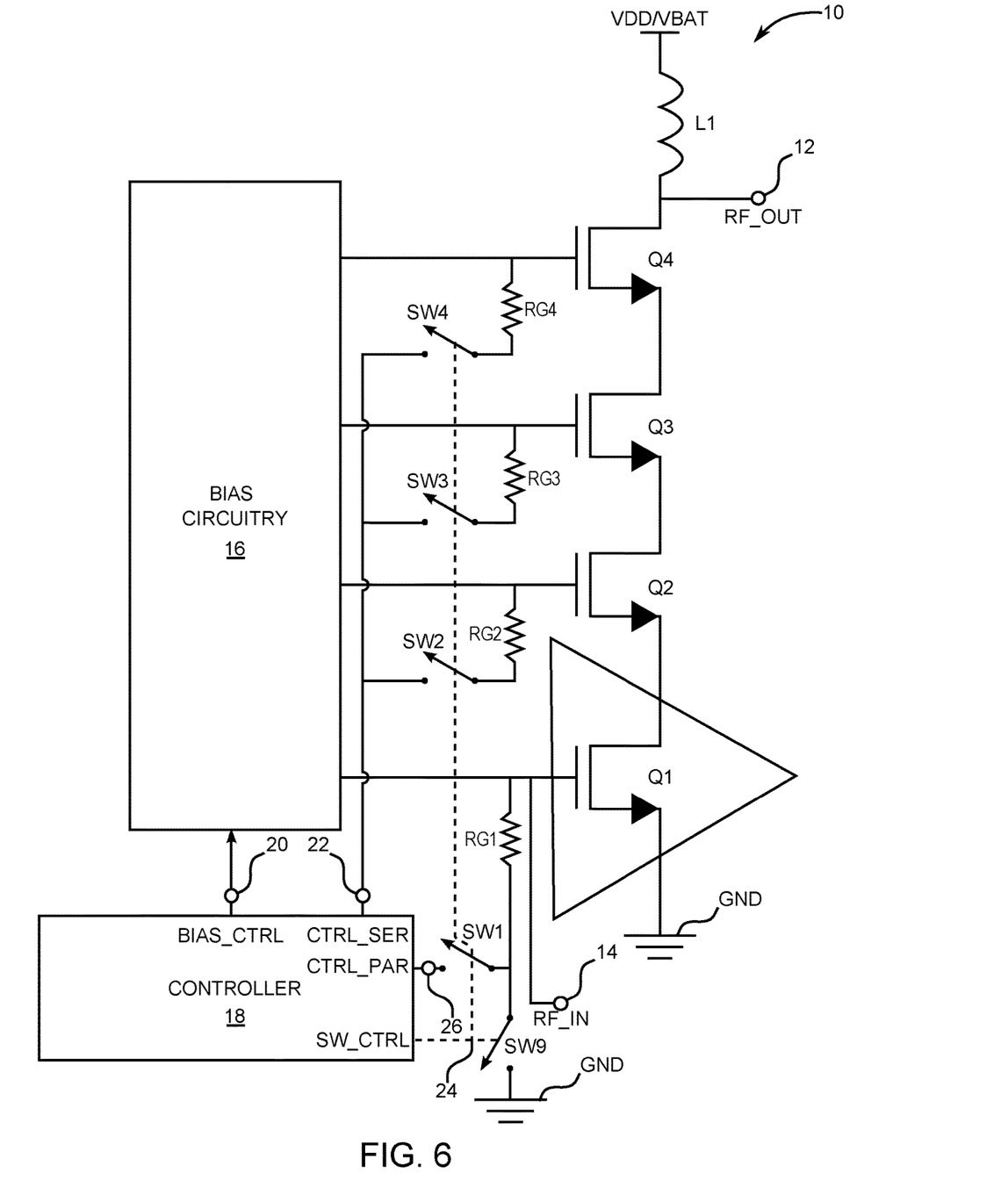
FIG. 6 is a diagram showing an alternate embodiment in which the transconductance device is reconfigured as a parallel switch while the cascode devices are reconfigured as a series switch.

FIG. 6 also depicts the gate resistors RG1, RG2, RG3, and RG4 coupled in series to realize a series gate resistor bias network. In a single-ended power amplifier version of the power amplifier system 10, it is advantageous to reconfigure the cascode devices that are the transistors Q2, Q3, and Q4 to act as the series switch with the series gate resistor bias network.

In large signal RF circuits, it is dangerous to leave floating nodes, as they can pump to high signal levels through parasitic coupling. For this reason most FEMs use a series-parallel switch combination, operating in the opposite way and usually non-overlapping. When the series switch is ON, the parallel switch is OFF, and vice versa.

In this regard, FIG. 6 shows an embodiment of the power amplifier system 10 that avoids floating nodes in the signal path when the power amplifier system 10 is not transmitting and is reconfigured as switch. In this embodiment, the transconductance device that is transistor Q1 is selectably reconfigured as a parallel switch, while the cascode devices that are the transistors Q2, Q3, and Q4 are reconfigured as series switches. The controller 18 generates appropriate on and off voltage levels at the ON/OFF voltage output terminal 22, which is relabeled CTRL_SER to indicate that the control of the series switch made from the transistors Q2, Q3, and Q4. Moreover, in this embodiment a second ON/OFF voltage output terminal 26 is selectively coupled to the gate of the transconductance device that is transistor Q1. The controller 18 also generates appropriate on and off voltage levels at the second ON/OFF terminal 26. The gate of transistor Q1 is further selectively coupled to the fixed voltage node GND by a ninth switch SW9 that is configured to be under the control of the controller 18. During operation, the transistor Q1 becomes a parallel switch when the ninth switch SW9 is closed.

Dedicated amplifier-mode switches and switch-mode switches can be placed to route the desired signals to the gates of the stacked devices. The equivalent switch may use a parallel gate bias resistor network or a series gate bias resistor network. The switches need to be connected accordingly. The gate bias switching is a low-power network that does not need large area switches. It also does not contribute significantly to the power amplifier efficiency (losses) since the impedance level at the gates is much larger than the impedance in the drain output. The power amplifier system 10 is realizable with differential amplifier stages and other types of power amplifiers, for example, Doherty and quadrature amplifiers.

Figure 7:
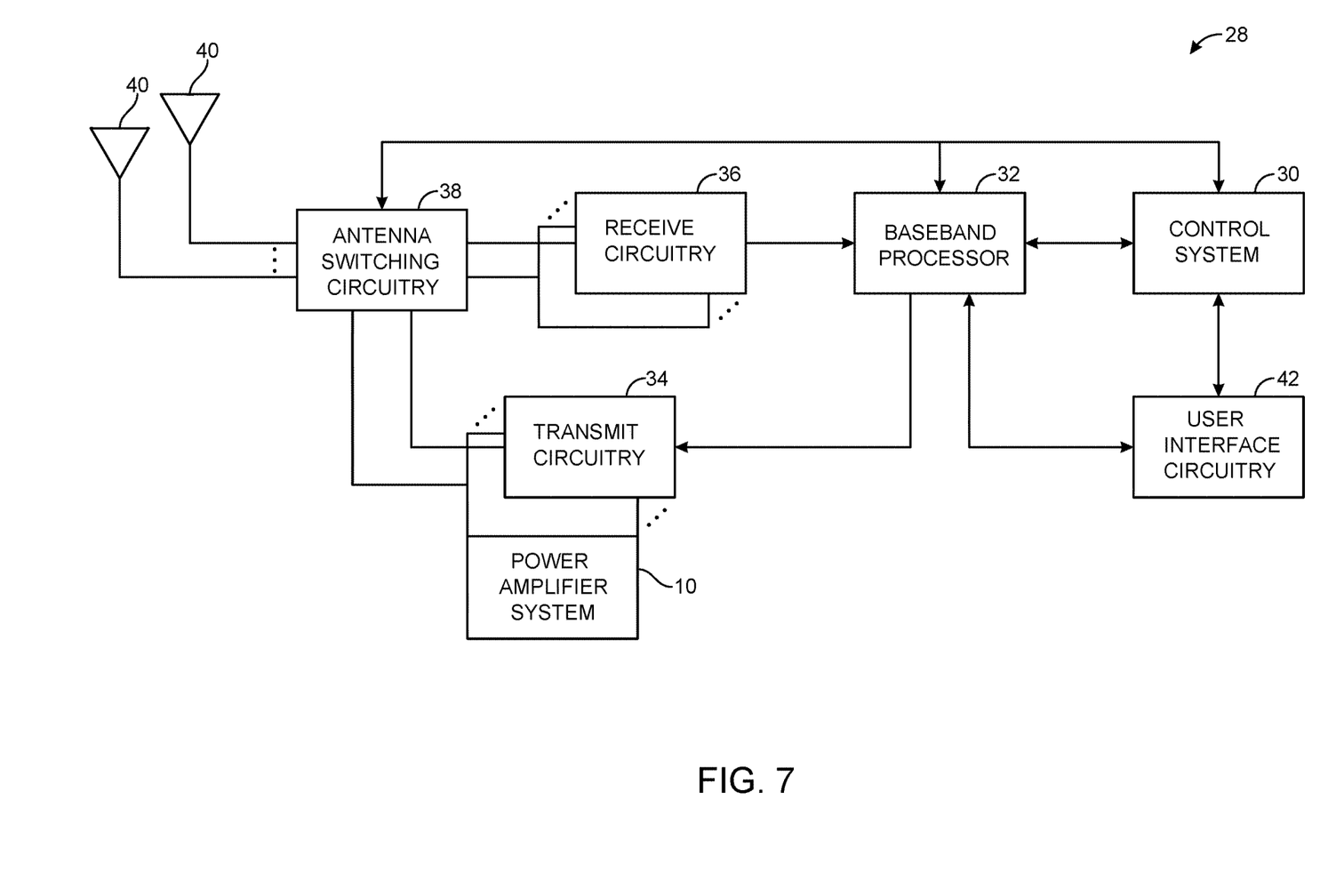
FIG. 7 is a diagram showing how the disclosed power amplifier system may interact with user elements such as wireless communication devices.

With reference to FIG. 7, the concepts described above may be implemented in various types of wireless communication devices or user elements 28, such as mobile terminals, smart watches, tablets, computers, navigation devices, access points, and the like that support wireless communications, such as cellular, wireless local area network (WLAN), Bluetooth, and near-field communications. The user elements 28 will generally include a control system 30, a baseband processor 32, transmit circuitry 34, receive circuitry 36, antenna switching circuitry 38, multiple antennas 40, and user interface circuitry 42. The receive circuitry 36 receives radio frequency signals via the antennas 40 and through the antenna switching circuitry 38 from one or more basestations. A low-noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams.

The baseband processor 32 processes the digitized received signal to extract the information or data bits conveyed in the received signal. This processing typically comprises demodulation, decoding, and error correction operations. The baseband processor 32 is generally implemented in one or more digital signal processors (DSPs) and application-specific integrated circuits (ASICs).

For transmission, the baseband processor 32 receives digitized data, which may represent voice, data, or control information, from the control system 30, which it encodes for transmission. The encoded data is output to the transmit circuitry 34, where it is used by a modulator to modulate a carrier signal that is at a desired transmit frequency or frequencies. A power amplifier will amplify the modulated carrier signal to a level appropriate for transmission, and deliver the modulated carrier signal to the antennas 40 through the antenna switching circuitry 38 to the antennas 40. The multiple antennas 40 and the replicated transmit and receive circuitries 34, 36 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A power amplifier system comprising:
    an N number of transistors coupled together drain-to-source between a supply node and a fixed voltage node with N being a counting number, wherein a first one of the N number of transistors coupled nearest to the fixed voltage node is configured to selectively operate as an amplifying device in an ON-mode, and remaining ones of the N number of transistors are configured to selectively operate as cascode devices in the ON-mode and to selectively operate as turned-off switches in an OFF-mode; and
    a controller configured to place the N number of transistors in the ON-mode when a radio frequency (RF) signal is to be amplified by the first one of the N number of transistors and to place the N number of transistors in the OFF-mode when the RF signal is not to be amplified by the first one of the N number of transistors, wherein the controller is further configured to provide switch control voltage levels through a serial switch output terminal selectively coupled to the gates of the remaining ones of the N number of transistors that are configured to selectively operate as cascode devices in the ON-mode and to selectively operate as turned-off switches in the OFF-mode.

2. The power amplifier system of claim 1, further comprising an N+1 transistor coupled between the N number of transistors and the supply node, wherein the N+1 transistor is configured to selectively operate as an amplifying device in the ON-mode, and the controller is further configured to place the N+1 transistor in the ON-mode when the RF signal is to be amplified by both the first one of the N number of transistors and the N+1 transistor.

3. The power amplifier system of claim 2 wherein substantially one-half of the N+1 transistors are P-channel field-effect transistors (FETs) and a remainder of the N+1 transistors are N-channel FETs.

4. The power amplifier system of claim 1, wherein the first one of the N number of transistors is configured to be a turned-on switch when the remaining N number of transistors are in the OFF-mode and the controller is further configured to place the first one of the N number of transistors in a conductive state to provide a current path to the fixed voltage node for the remaining N number of transistors in the OFF-mode.

5. The power amplifier system of claim 1 wherein the controller is further configured to provide switch control voltage levels through a parallel switch output terminal selectively coupled to the gate of the first one of the N number of transistors coupled nearest to the fixed voltage node that is configured to selectively operate as an amplifying device in the ON-mode and a parallel switch in the OFF-mode.

6. The power amplifier system of claim 1 further comprising an N number of gate resistors, each of which is coupled to a gate of a respective one of the N number of transistors selectively coupled through an N number of switches to an ON/OFF voltage output terminal.

7. The power amplifier system of claim 6 wherein the controller is configured to open and close the N number of switches by way of a control bus.

8. The power amplifier system of claim 7 further comprising a plurality of series-coupled gate resistors coupled between the gates of the N number of transistors.

9. The power amplifier system of claim 1 wherein the N number of transistors is of the partially depleted silicon-on-insulator (SOI) complementary metal oxide semiconductor (CMOS) type.

10. The power amplifier system of claim 1 wherein the N number of transistors is of the fully depleted silicon-on-insulator (SOI) complementary metal oxide semiconductor (CMOS) type.

11. The power amplifier system of claim 1 further comprising bias circuitry that is coupled to the gates of the N number of transistors and is configured to bias the N number of transistors for amplifier operation.

12. The power amplifier system of claim 11 further including switches coupled between the bias circuitry and gates of the N number of transistors, wherein the controller is configured to close the switches to provide bias in the ON-mode and open the switches in the OFF-mode.

13. The power amplifier of claim 1 wherein the fixed voltage node is ground.

14. A method of operating a power amplifier system comprising an N number of transistors coupled together drain-to-source between a supply node and a fixed voltage node with N being a counting number, wherein a first one of the N number of transistors coupled nearest to the fixed voltage node, and a controller configured to control switches coupled between gates of the N number of transistors and a serial switch output terminal, the method comprising:
selectively closing the switches by way of the controller to place the N number of transistors in the OFF-mode when an RF signal is not to be amplified by the first one of the N number of transistors;
selectively opening the switches by way of the controller to place the N number of transistors in the ON-mode when the RF signal is to be amplified by the first one of the N number of transistors; and
providing switch control voltage levels by way of the controller through the serial switch output terminal coupled to the gates of remaining ones of the N number of transistors, wherein the remaining ones are selectively operated as cascode devices in the ON-mode and as turned-off switches in the OFF-mode.

15. A wireless communication device comprising:
a baseband processor;
transmit circuitry configured to receive encoded data from the baseband processor and to modulate a carrier signal with the encoded data, wherein the transmit circuitry comprises:
an N number of transistors coupled together drain-to-source between a supply node and a fixed voltage node with N being a counting number, wherein a first one of the N number of transistors coupled nearest to the fixed voltage node is configured to selectively operate as an amplifying device in an ON-mode, and remaining ones of the N number of transistors are configured to selectively operate as cascode devices in the ON-mode and to selectively operate as turned-off switches in an OFF-mode; and
a controller configured to place the N number of transistors in the ON-mode when a radio frequency (RF) signal is to be amplified by the first one of the N number of transistors and to place the N number of transistors in the OFF-mode when the RF signal is not to be amplified by the first one of the N number of transistors, wherein the controller is further configured to provide switch control voltage levels through a serial switch output terminal selectively coupled to the gates of the remaining ones of the N number of transistors that are configured to selectively operate as cascode devices in the ON-mode and to selectively operate as turned-off switches in the OFF-mode; and
at least one antenna coupled to the transmit circuitry to transmit the carrier signal.

16. The wireless communication device of claim 15 further comprising an N+1 transistor coupled between the N number of transistors and the supply node, wherein the N+1 transistor is configured to selectively operate as an amplifying device in the ON-mode, and the controller is further configured to place the N+1 transistor in the ON-mode when the RF signal is to be amplified by both the first one of the N number of transistors and the N+1 transistor.

17. The wireless communication device of claim 16 wherein substantially one-half of the N+1 transistors are P-channel field-effect transistors (FETs) and a remainder of the N+1 transistors are N-channel FETs.

18. The wireless communication device of claim 15, wherein the first one of the N number of transistors is configured to be a turned-on switch when the remaining N number of transistors are in the OFF-mode and the controller is further configured to place the first one of the N number of transistors in a conductive state to provide a current path to the fixed voltage node for the remaining N number of transistors in the OFF-mode.

19. The wireless communication device of claim 15 wherein the controller is further configured to provide switch control voltage levels through a parallel switch output terminal selectively coupled to the gate of the first one of the N number of transistors coupled nearest to the fixed voltage node that is configured to selectively operate as an amplifying device in the ON-mode and a parallel switch in the OFF-mode.

20. The wireless communication device of claim 15 further comprising an N number of gate resistors, each of which is coupled to a gate of a respective one of the N number of transistors selectively coupled through an N number of switches to an ON/OFF voltage output terminal.

21. The wireless communication device of claim 20 wherein the controller is configured to open and close the N number of switches by way of a control bus.

22. The wireless communication device of claim 21 further comprising a plurality of series-coupled gate resistors coupled between the gates of the N numbers of transistors.

23. The wireless communication device of claim 15 wherein the N number of transistors are of the partially depleted silicon-on-insulator (SOI) complementary metal oxide semiconductor (CMOS) type.

24. The wireless communication device of claim 15 wherein the N number of transistors are of the fully depleted silicon-on-insulator (SOI) complementary metal oxide semiconductor (CMOS) type.

25. The wireless communication device of claim 15 further comprising bias circuitry that is coupled to the gates of the N number of transistors and is configured to bias the N number of transistors for amplifier operation.

26. The wireless communication device of claim 25 further including switches coupled between the bias circuitry and gates of the N number of transistors, wherein the controller is configured to close the switches to provide bias in the ON-mode and open the switches in the OFF-mode.

27. The wireless communication device of claim 15 wherein the fixed voltage node is ground.

* * * * *